United States Patent
Bailey (10) Patent No.: US 6,356,862 B2
(45) Date of Patent: *Mar. 12, 2002

(54) HARDWARE AND SOFTWARE CO-VERIFICATION EMPLOYING DEFERRED SYNCHRONIZATION

(76) Inventor: Brian Bailey, 20444 S. Jason Dr., Oregon City, OR (US) 97045

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/160,368

(22) Filed: Sep. 24, 1998

(51) Int. Cl.[7] .............................................. G06F 17/50
(52) U.S. Cl. ............................ 703/16; 703/19; 703/22; 703/26; 703/20
(58) Field of Search ........................... 703/16, 20, 22, 703/26, 15, 19; 716/5

(56) References Cited

U.S. PATENT DOCUMENTS

| 4,901,260 A | * | 2/1990 | Lubachevsky | 364/578 |
| 5,408,470 A | * | 4/1995 | Rothrock et al. | 370/62 |
| 5,737,583 A | * | 4/1998 | Jones et al. | 395/500 |
| 5,771,370 A | * | 6/1998 | Klein | 395/500 |
| 5,794,005 A | * | 8/1998 | Steinman | 395/500 |
| 5,805,859 A | * | 9/1998 | Giramma et al. | 395/500 |
| 5,841,967 A | * | 11/1998 | Sample et al. | 395/183.09 |
| 5,862,361 A | * | 1/1999 | Jain | 395/500 |
| 6,006,022 A | * | 12/1999 | Rhim et al. | 395/500.02 |

OTHER PUBLICATIONS

Sumit Ghosh, "Behavioral-Level Fault Simulation," IEEE, 1988, pp. 31–42.*
Jeff Steinman, "Interactive SPEEDES," IEEE, 1991, pp. 149–158.*

* cited by examiner

Primary Examiner—Kevin J. Teska
Assistant Examiner—Thai Phan
(74) Attorney, Agent, or Firm—Columbia IP Law Group, PC

(57) ABSTRACT

Hardware and software of a system is co-verified with synchronization events generated in the respective hardware and software verifications being accumulated and provided to the other verification on a periodic basis. The faster verification is halted to allow the slower verification to catch up, upon expiration of a synchronization window. Once caught up, the accumulated synchronization events are provided to the respective other verification. The transferred synchronization events are then in turn injected into the other verification at the same offset time into a synchronization period the synchronization events occurred in the previous synchronization period.

36 Claims, 8 Drawing Sheets

HARDWARE AND SOFTWARE CO-VERIFICATION EMPLOYING DEFERRED SYNCHRONIZATION

BACKGROUND OF THE INVENTION

1. Field of the Invention

The present invention relates to the field of digital system design verification. More specifically, the present invention relates to design verification of digital systems whose development efforts are neither hardware nor software dominant.

2. Background Information

The majority of digital systems being designed today are task specific embedded systems that consist of standard and/or custom hardware as well as standard and/or custom software. Standard hardware typically includes off-the-shelf microprocessor/micro-controller, and memory etc., whereas custom hardware is implemented with programmable logic devices (PLDs), or Application Specific Integrated Circuits (ASICs). Hardware architecture binds and constrains these resource and provides a framework on which software processes execute. Standard software typically includes a real time operating system (RTOS), and configurable device drivers, whereas customer software is the embedded application. Software architecture defines how these processes communicate. The complexity of these embedded systems varies widely from low to high end depending on the market segment and product goals. They can be found in almost everything that we encounter in our daily lives, such as communication systems ranging from the phone on our desk, to the large switching centers, automobiles, consumer electronics, etc.

Some embedded systems are software dominant in their development effort, in that most of the design efforts are focused on implementing the functionality in software. Typically, standard or previously designed hardware are employed. Thus, even though the software dominant characteristic typically makes these systems a lot more cost sensitive, these systems can be readily validated by compiling and debugging the software under development on existing hardware, using a compiler, a debugger and other related software tools.

Other embedded systems are hardware dominant, in that most of the design efforts are focused on implementing the functionality in PLDs or ASICs. The original software content of these systems tends to be small. Typically, these embedded systems are found in applications where performance is critical. For these systems, hardware emulation and/or simulation techniques known in the art appear to adequately serve the design verification needs. In the case of emulation, the hardware is "realized" by configuring the reconfigurable logic and interconnect elements of the emulator. The configuration information are generated by "compiling" certain formal behavioral specification/description of the hardware. In the case of simulation, a simulation model would be developed. For the more "complex" hardware, since it is very difficult, if not outright impossible, to model all the behaviors of the hardware, certain accuracy are often sacrificed. For example, in the case of a microprocessor, it is often modeled by a "bus interface model", i.e. only the different bus cycles that the processor can execute are modeled. The modeled bus cycles are driven in timed sequences, representative of typical bus transactions or bus activities for invoking specific conditions.

Embedded systems that are most difficult to validate are those that are neither software or hardware dominant, in that both parts play an equally important role in the success of the system. Due to increased time to market pressures, hardware and software are usually developed in parallel. Typically, the hardware designers would validate the hardware design using an hardware simulator or emulator. Concurrently, the software designer would validate the software using an instruction set simulator on a general purpose computer. The instruction set simulator simulates execution of compiled assembly/machine code for determining software correctness and performance at a gross level. These instruction set simulators often include facilities for handling I/O data streams to simulate to a very limited degree the external hardware of the target design. Typically, instruction set simulators run at a speeds of ten thousand to over a million instructions per second, based on their level of detail and the performance of the host computer that they are being run on.

Traditionally, the hardware and software would not be validated together until at least a prototype of the hardware, having sufficient amount of functionality implemented and stabilized, becomes available. The software is executed with a hardware simulator, and very often in cooperation with a hardware modeler (a semiconductor tester), against which the hardware prototype is coupled. The hardware simulator provides the hardware modeler with the values on the input pins of the prototype hardware, which in turn drives these values onto the actual input pins of the prototype hardware. The hardware modeler samples the output pins of the prototype hardware and returns these values to the hardware simulator. Typically, only one to ten instructions per second can be achieved, which is substantially slower than instruction set simulation.

Recently, increasing amount of research effort in the industry has gone into improving hardware and software co-verification. New communication approaches such as "message channels" implemented e.g. using UNIX®"pipes"have been employed to facilitate communication between the hardware and software models (UNIX is a registered trademark of Santa Cruz Software, Inc.). Other efforts have allowed the models to be "interconnected" through "registers", "queues", etc. In U.S. Pat. Nos. 5,771,370 and 5,768,567, an optimizing hardware-software co-verification system was disclosed.

Notwithstanding these advances, the fundamental fact remains that a rather detailed hardware model is required before it is possible to verify software concepts within the hardware context. As a result, the concurrent development of hardware and software have to proceed without the ability to verify the interfaces between the hardware and software being contemplated. Furthermore, without such verification, the partitioning choices on what is to be implemented in hardware versus software have become increasingly more difficult as the complexity of the embedded systems continue to increase.

To address this problem, the industry looks to higher level of abstraction to describe the hardware components, i.e. describing the hardware components only in terms of their functionality and not their implementations. These high level models are commonly referred to as "system models", and are executed within a system or transaction level simulator, which typically executes 10–100× faster than historical simulators that operate with a lower level of abstraction. With the enhanced execution rate, these system or transaction level simulators are much more capable of keeping up with the simulators employed to execute the software.

However, these system or transaction level simulators have not gained wide acceptance because the combined performance has been constrained by the communications between the simulators. As the general performance of the simulators increases, the performance of the synchronization and transfer of information between the simulators become even more important.

A successful synchronization strategy must ensure the consistency of the verifications, i.e. for a fixed set stimulus, the verification results must always be the same. Preferably, it should allow both verifications to proceed concurrently, without impeding performance. Furthermore, it should allow either verification to operate as a source or sink for information, and it should be flexible in the resolution of synchronization periods. Prior art synchronization strategies typically require either verifications to be performed in locked step, resulting in substantial degradation in software verification performance, or employ roll back mechanism, which imposes significant memory hardware burden on the co-verification system. Thus, an improved approach to co-verification synchronization is desired.

SUMMARY OF THE INVENTION

Hardware and software of a system is co-verified with synchronization events generated in the respective hardware and software verifications being accumulated and provided to the other verification on a periodic basis. The faster verification is halted to allow the slower verification to catch up, upon expiration of a synchronization window. Once caught up, the accumulated synchronization events are provided to the respective other verification. The transferred synchronization events are then in turn injected into the other verification at the same offset time into a synchronization period the synchronization events occurred in the previous synchronization period.

In one embodiment, a co-verification coordinator is provided with a flow detector, a synchronizer and a configurator to facilitate practice of the present invention. The flow detector includes logic for monitoring, detecting, and accumulating software synchronization events. The synchronizer includes logic for halting the faster (software) verification, and detecting whether the slower (hardware) verification has caught up. The synchronizer further includes logic for transferring the software synchronization events accumulated by the flow detector to the hardware verification for subsequent injection into the hardware verification, as well as receiving and forwarding hardware synchronization events accumulated by the hardware verification to the flow detector for subsequent injection into the software verification. Finally, the configurator includes logic to facilitate configuration and reconfiguration of the synchronization window size.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As well understood by those skilled in the art, these quantities take the form of electrical, magnetic, or optical signals capable of being stored, transferred, combined, and otherwise manipulated through mechanical and electrical components of the computer system; and the term computer system include general purpose as well as special purpose data processing machines, systems, and the like, that are standalone, adjunct or embedded.

Various operations will be described as multiple discrete steps performed in turn in a manner that is most helpful in understanding the present invention, however, the order of description should not be construed as to imply that these operations are necessarily order dependent, in particular, the order the steps were described.

Figure 1:
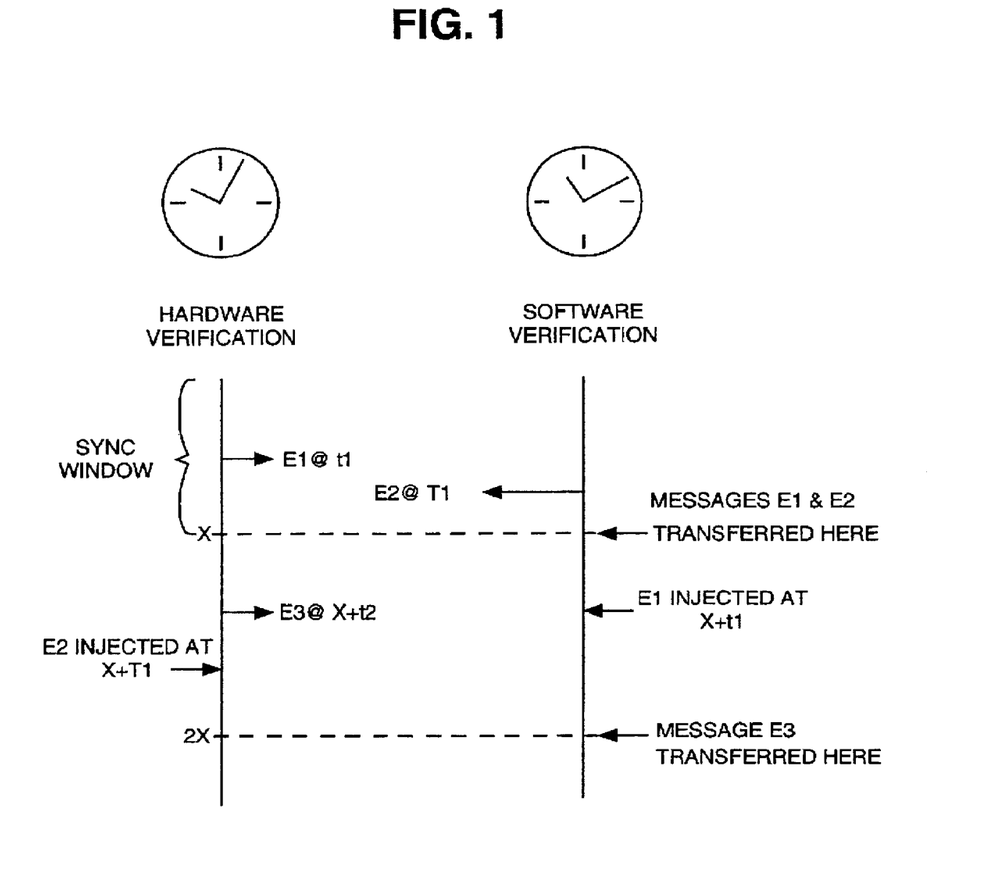
FIG. 1 gives a broad overview of the hardware-software co-verification synchronization strategy of the present invention.

Refer now to FIG. 1, wherein a broad overview of hardware-software co-verification synchronization strategy of the present invention is shown. As illustrated, in accordance with the present invention, hardware and software of a system is co-verified with synchronization events generated in the respective hardware and software verifications being accumulated and provided to the other verification on a periodic basis. The faster verification, typically, the software verification, waits for the slower verification, typically, the hardware verification, when the faster verification reaches the end of the synchronization period first. The exchanged synchronization events in turn are subsequently introduced in the other verification in the next synchronization period (also referred to as synchronization or sync window) at the same timing offsets the synchronization events occurred in the previous synchronization period. For examples, instead of communicating synchronization events E1 and E2 (occurred at time t1 and T1 of the current synchronization period respectively) to the other verification immediately as the events occur, communication of the events are deferred to the end of the synchronization period. The synchronization events are exchanged after both verifications have reached the end of the synchronization window. Upon communication to the other verification, events E1 and E2 are subsequently introduced into the other verification at time X+t1 and X+T1 respectively, X being the end time the current synchronization period.

In other words, under the present invention, introduction of synchronization events in the other verification are delayed by the size of the synchronization window. For portions of the verifications where accuracy is not important, e.g. non-critical portions or portions of little interest to the designer, a large synchronization window size may be employed, allowing the verifications to advance rapidly. However, for portions of the verifications where accuracy is important, e.g. critical portions or portions of special interest to the designer, a small synchronization window size may be employed, providing increased resolution to the designer. In extreme cases, the size of the synchronization window may be set to a single clock or instruction. This is equivalent to performing the co-verification in locked step. Except for these rare extreme cases, such locked step co-verification is unnecessary, as all communications between verifications will incur a fixed delay, because of driver or other communication overhead associated with the transfer of information. Thus, the synchronization window typically can be set to at least mimic the delay that will be encountered by the verifications anyway. In doing so, as those skilled in the art will appreciate, significant communication savings can be realized. This is because the time required to exchange multiple messages is only fractionally larger than the time required to exchange a single message, as substantial portion of the amount of time incurred in exchanging a single message is expended in the initial protocol and post-exchange tear down phases. Thus, the synchronization strategy of the present invention offers improved efficiency over the locked step approach, and yet provides virtually the same accuracy level. Additionally, the variability of the size of the synchronization window provides great flexibility to the designer. For certain designs (or certain stages of a design), where a number of relatively large synchronization windows may be employed for multiple stages of the co-verification, the improvement in efficiency actually approaches that of the "roll back" approach, but without requiring a large amount of hardware resources as the "roll back" approach.

Any time units may be employed for the deferred synchronization strategy of the present invention, including but not limited to instructions or cycles. In fact, different time units may be employed by the different verifications. While cycles would give a finer resolution, it is actually not needed, especially for simulations, where it is not possible to accurately measure the wait states injected or other hardware effects. Neither can more than one interaction occur within a single instruction execution window. In addition, software simulation can never be sensitive to things at the cycle level, since it can never see anything with less than instruction resolution. Thus, generally, instruction count, is probably the optimal time unit to use. When considering native compiled simulations, I/O counts may be used to indicate passage of time. A program that performed no I/O and was waiting on an interrupt could cause a problem. If the designer is aware of such potential problem, a special subroutine call is provided in the co-verification environment to address the potential problem. The call would be used to wait for a message from the system level simulator. On the system simulator side, a notion of time may be provided, and additionally, the designer is provided with the ability to configure the relationship between the two.

Figure 2:
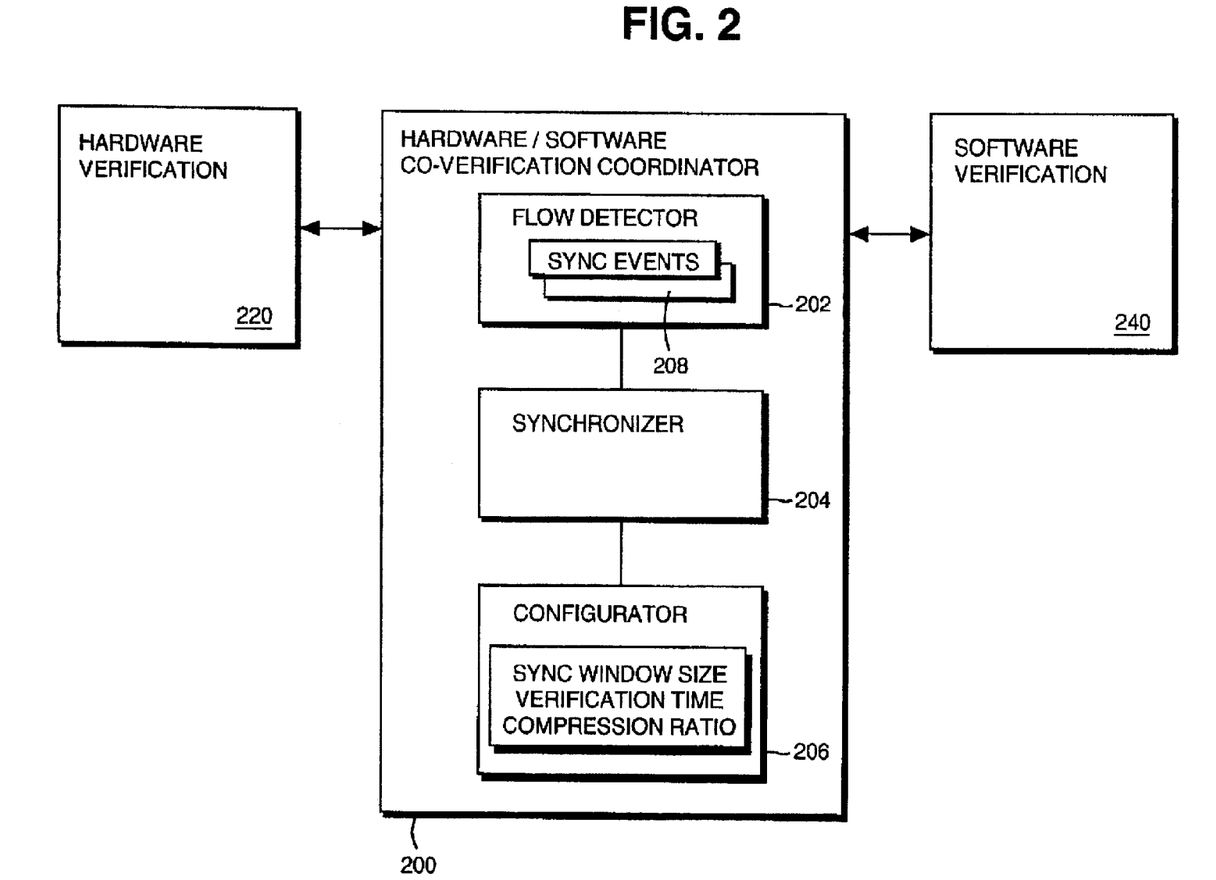
FIG. 2 illustrates one embodiment of a hardware-software co-verification coordinator for practicing the present invention.

FIG. 2 illustrates one embodiment a hardware-software co-verification coordinator incorporated with the teachings of the present invention. As shown, hardware-software co-verification coordinator (HSCC) 200 facilitates co-verification, i.e. concurrent hardware verification 220 and software verification 240 for a hardware-software system. For the illustrated embodiment, HSCC 200 includes flow detector 202, synchronizer 204 and configurator 206, cooperating with each other to coordinate the co-verification, employing the variable deferred synchronization strategy of the present invention highlighted above. Hardware verification 220 may be performed using a system or transaction level simulator. Alternatively, it may be performed using a logic simulator or an emulator instead. Software verification 240 may be performed using an instruction set simulator (ISS), compiled simulation, and the like. In the case of hardware-software simulations, the simulations may be performed on different machines or the same machine. With respect to practicing the present invention, the only requirement is the ability for the hardware verification to accumulate hardware synchronization events, and to inject an exchanged software synchronization event at a specific point in time (i.e. at an offset point into a sync window). Such hardware and software verifications, including the required event accumulation and injection ability, are well known, and will not be further described.

Except for the teachings of the present invention incorporate, i.e. flow detector 202, synchronizer 204 and configurator 206, HSCC 200 is also intended to represent a broad range of co-verification coordinator or environment known in the art. A particular example is the Seamless CVE product available from Mentor Graphics Corporation of Wilsonville, Oreg., assignee of the present invention. Accordingly, except for the enumerated enhancements, HSCC 200 will not be otherwise further described either. Flow detector 202 is used to monitor operations being performed in memory, and transform these operations into abstract flows suitable for use by hardware verification 220. Such transformation is also known in the art and will not be further described. However, as will be described in more detail below, flow detector 202 is also used to monitor, detect and accumulate software synchronization events arising in software verification 240. Upon detection, flow detector 202 accumulates the detected software synchronization events into a number of organized data structures 208. (Hardware synchronization events are accumulated by hardware verification 220.) Synchronizer 204 is used to monitor whether the synchronization window has elapsed, if so halts the faster (software) verification to wait for the slower (hardware) verification, and facilitate transfer of the accumulated synchronization events between hardware verification 220 and flow detector 202. Configurator 206 is used to configure various operational parameters of HSCC 200, in particular, the size of the synchronization window and when necessary, a verification time compression ratio, for practicing the present invention, to be described more fully below.

Figure 3:
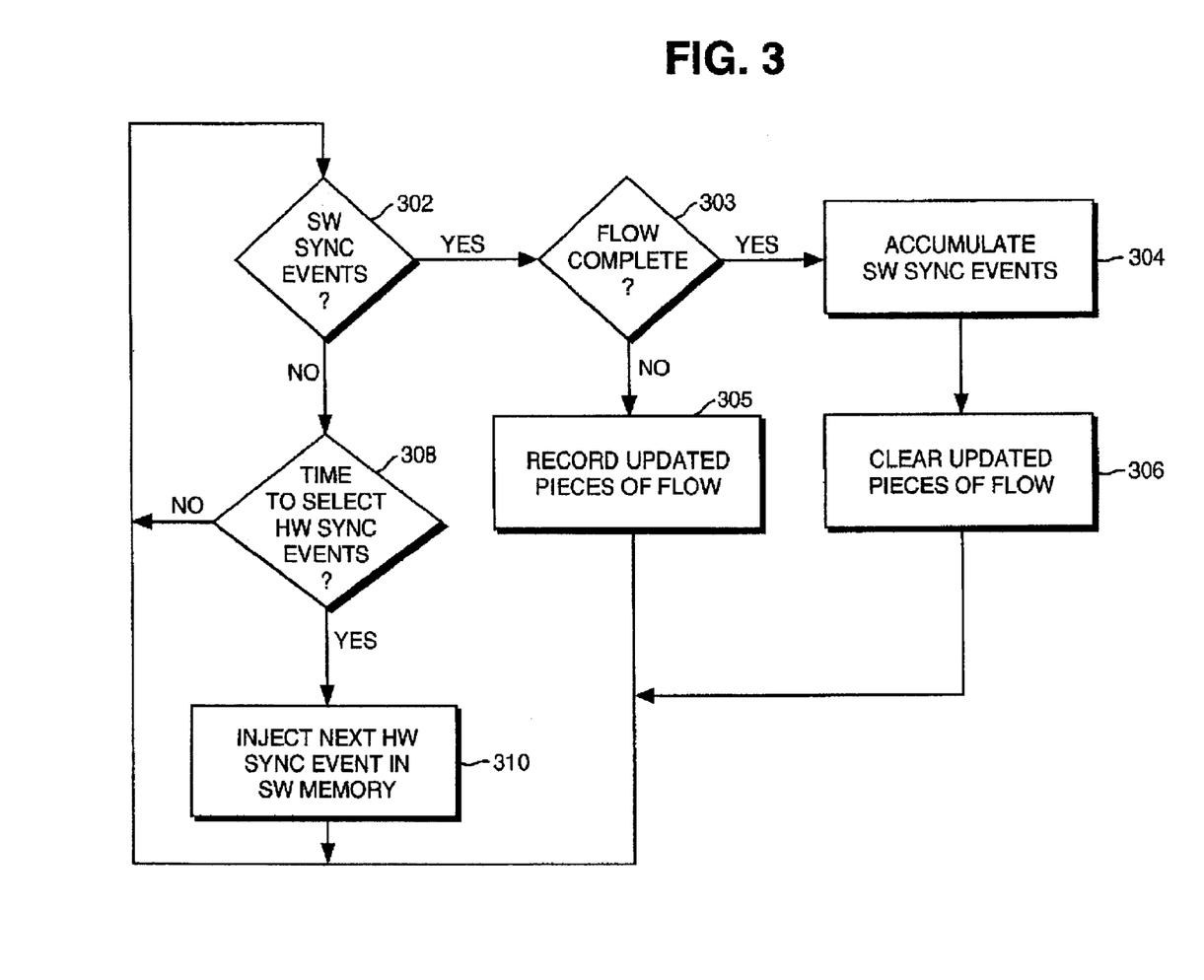
FIGS. 3–4 illustrate one embodiment each of the operational flow of the flow detector and the synchronizer of FIG. 2.
Figure 4:
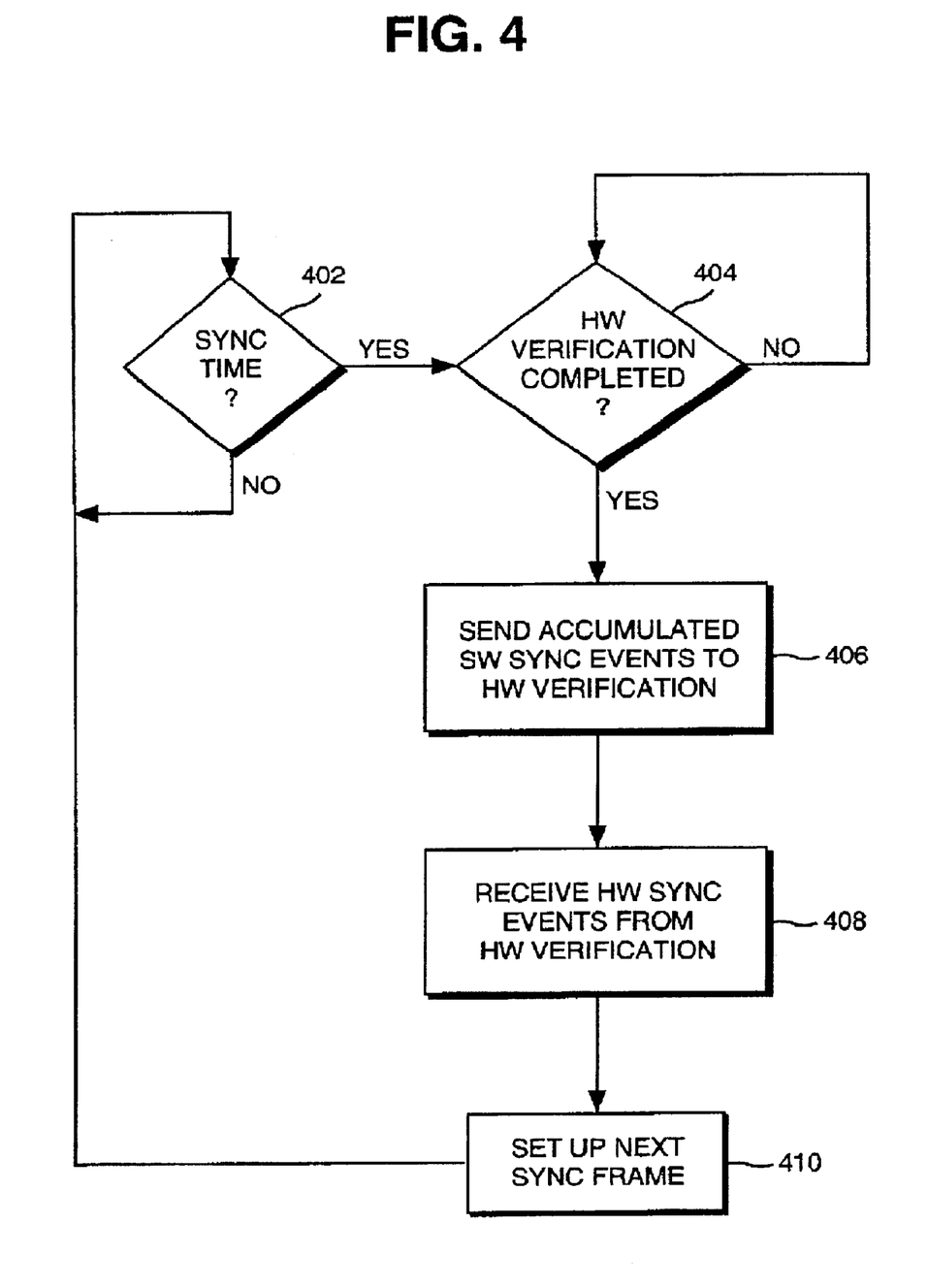

FIG. 3 illustrates one embodiment of the operational flow of flow detector 202. As shown, for the illustrated embodiment, flow detector 202 monitors for software synchronization events arising from the software verification, step 302. Upon detection, flow detector 202 determines the flow from which the synchronization event arises is completed or not, step 303. (As will be appreciated by those skilled in the art, some flows take multiple discrete steps to complete, e.g. the writing of a 32-bit integer in multiple chunks.) If the flow is not completed, flow detector 202 simply records the updated portion of the flow, step 305, and continues at step 302. However, if the flow is complete, flow detector 202 accumulates the detected software synchronization event into one of the organized data structures, step 304, and clears the previously updated portions of the flow, step 306. In one embodiment, flow detector 202 monitors for all writes to memory by the software verification. Upon detecting the completion of a write to memory, flow detector 202 copies the write operation, and stores the copied operation into a synchronization event accumulation queue. Steps 308 and 310 will be described after describing FIG. 4. FIG. 4 illustrates one embodiment of the operational flow of synchronizer 204. As shown, synchronizer 204 monitors for whether the current synchronization period has elapsed, step 402. If the current synchronization period has not elapsed, synchronizer 204 returns to step 402, otherwise, it proceeds to step 404. At step 404, synchronizer 204 halts the faster verification, typically, software verification 240, to allow the slower verification, typically, hardware verification 220, to catch up. Upon detecting the slower verification having caught up, synchronizer 204 facilitates transfer of the accumulated synchronization events between the hardware verification and flow detector 202, step 406–408. In one embodiment, the synchronization events are exchanged with the timing information, that is the offset into the next synchronization period the events should be injected into the respective verifications. In one embodiment, synchronizer 204 is responsible for the establishment of the communication channels, and closing the communication channels at the end of the exchange, as well as the facilitating exchange of the accumulated synchronization events. Upon completion of the exchange, synchronizer 204 sets up the next synchronization frame, step 410.

Referring now back to FIG. 3, recall that upon exchange, flow detector 202 is in possession of the hardware synchronization events arisen in the last synchronization frame. In one embodiment, similar to the software synchronization events, flow detector 202 stores the exchanged hardware synchronization events in selected ones of the organized data structures. Thus, at step 302, if it was determined that no software synchronization event has been detected, flow detector 202 proceeds to step 308 to determine if it is time to inject one of the received hardware synchronization event of the last synchronization period into the software verification. If it is determined that it is not time to inject one of the received hardware synchronization event into the software verification, flow detector 202 continues at step 302. Otherwise, flow detector 202 injects the hardware synchronization event into the software verification, step 310, before continuing at step 302.

Figure 5:
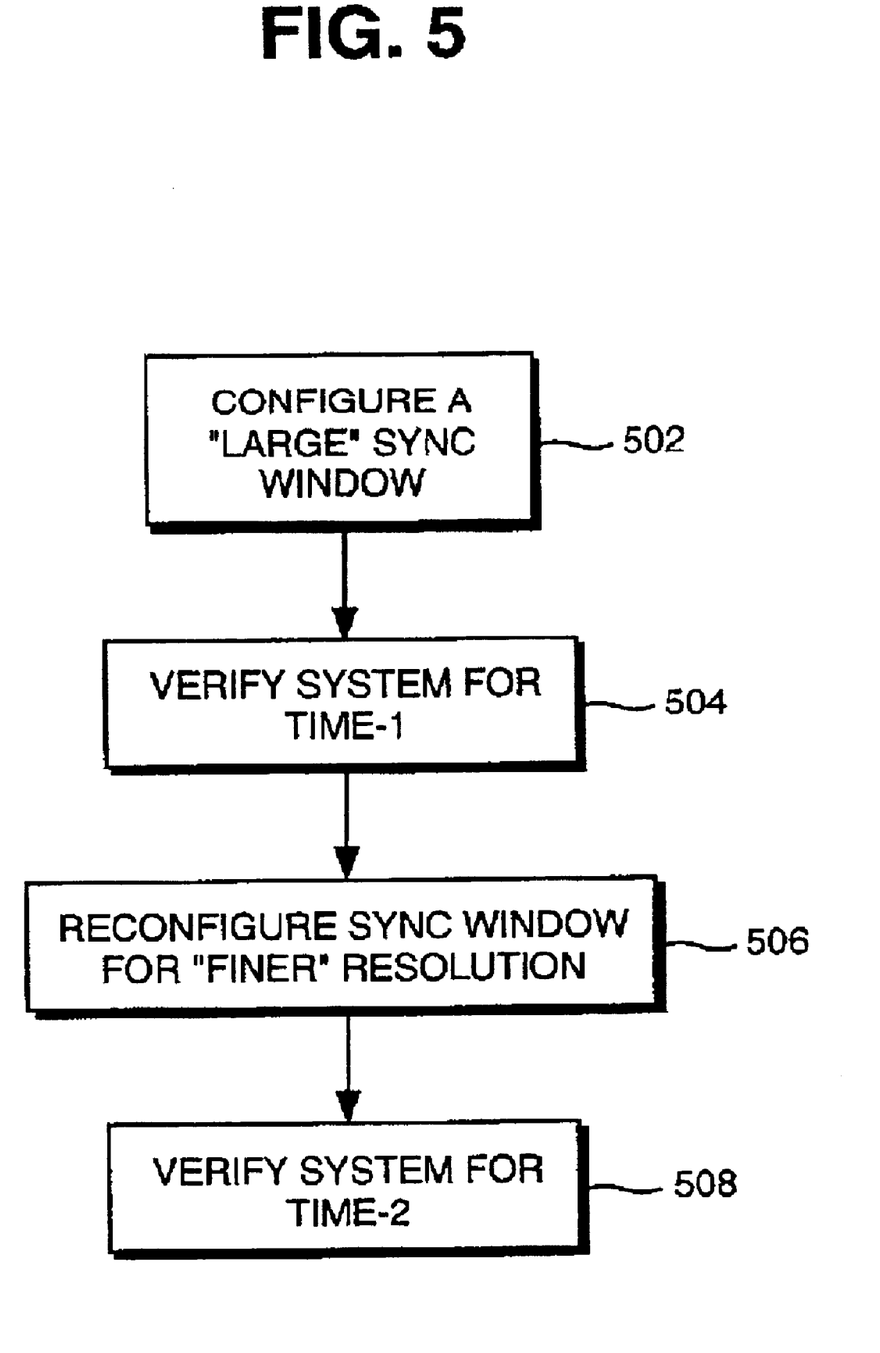
FIG. 5 illustrates a method for practicing the present invention.

FIG. 5 illustrates a method for practicing the present invention. As shown, at step 502, a designer configure HSCC to coordinate the verifications using a synchronization window of relatively "large" size. At step 504, the designer starts the co-verification for Time-1 using the relatively large synchronization window, allowing the verifications to quickly advance to a point of interest to the designer. Next, at step 506, the designer reconfigures the size of the synchronization window to a "finer" resolution, i.e. a smaller window size. At step 508, the designer continues the co-verification for Time-2 using the smaller synchronization window, providing the designer with finer resolution. Steps 502–508 may be repeated as many times as it is necessary for the designer to obtain the required information to debug the design.

Figure 6:
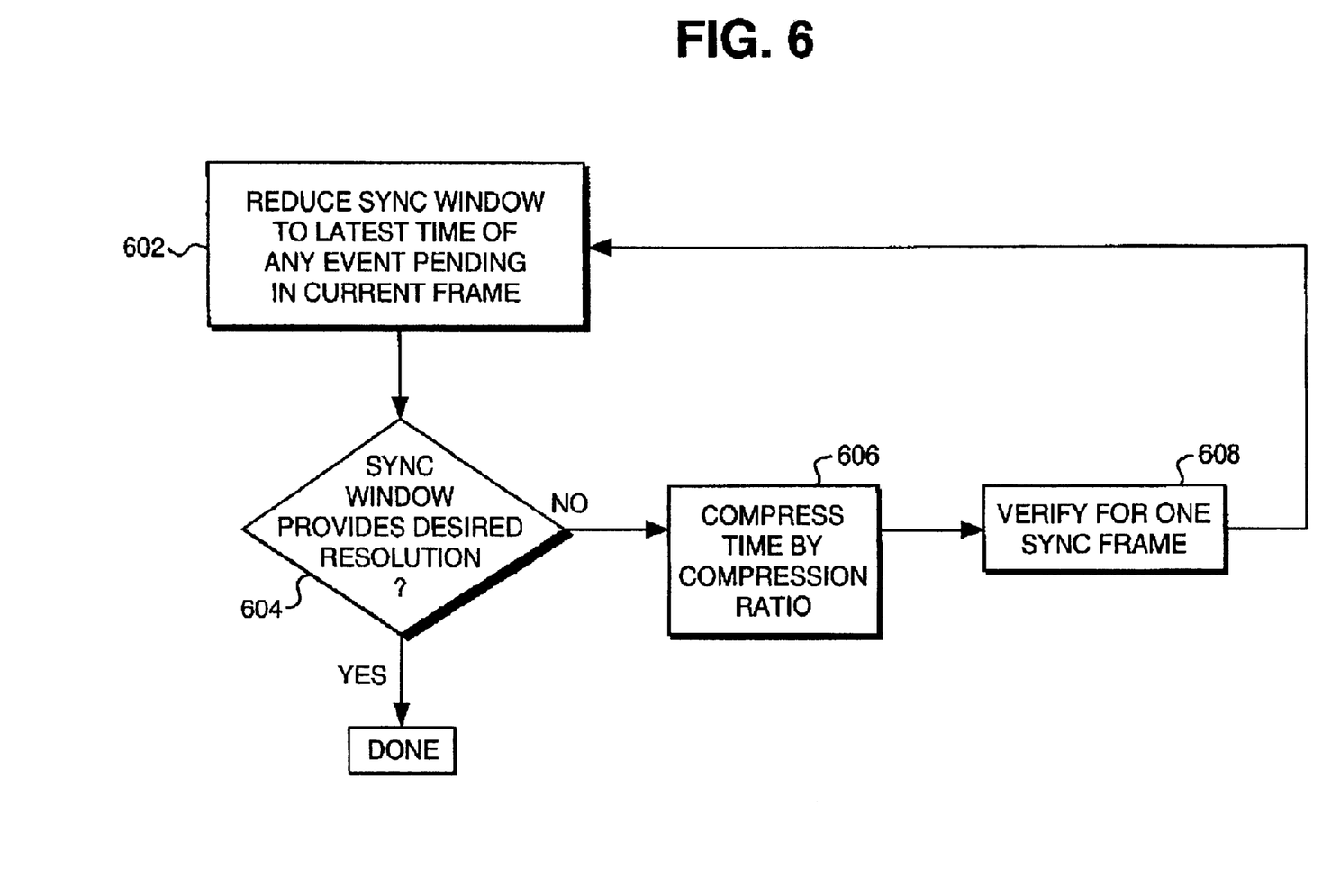
FIG. 6 illustrates one embodiment of the step of configuring the predetermined synchronization interval to a smaller size.

FIG. 6 illustrates an embodiment of step 506, configuring the synchronization window to a smaller window size. Note that no special steps are required to perform step 502, i.e. configuring the synchronization window to a larger window.

At step 602, the synchronization window is first reduced to the latest time of any event pending in the current synchronization window. If the new reduced synchronization window provides the desired resolution, step 604, the process terminates; otherwise the process continues at step 606. At step 606, i.e. the reduced synchronization window does not provide the desired resolution, the designer configures a verification time compression ratio for the co-verification. Then, at step 608, co-verification is allow to proceed for one synchronization window (or frame). Upon co-verifying the hardware and software for one frame, the process continues at step 602. Eventually, upon repeating process steps 502–608 for a few iterations, the desired finer resolution synchronization window with the desired smaller window size is reached. Experience has shown that the desired finer resolution typically can be achieved in a few synchronization frames.

Figure 7:
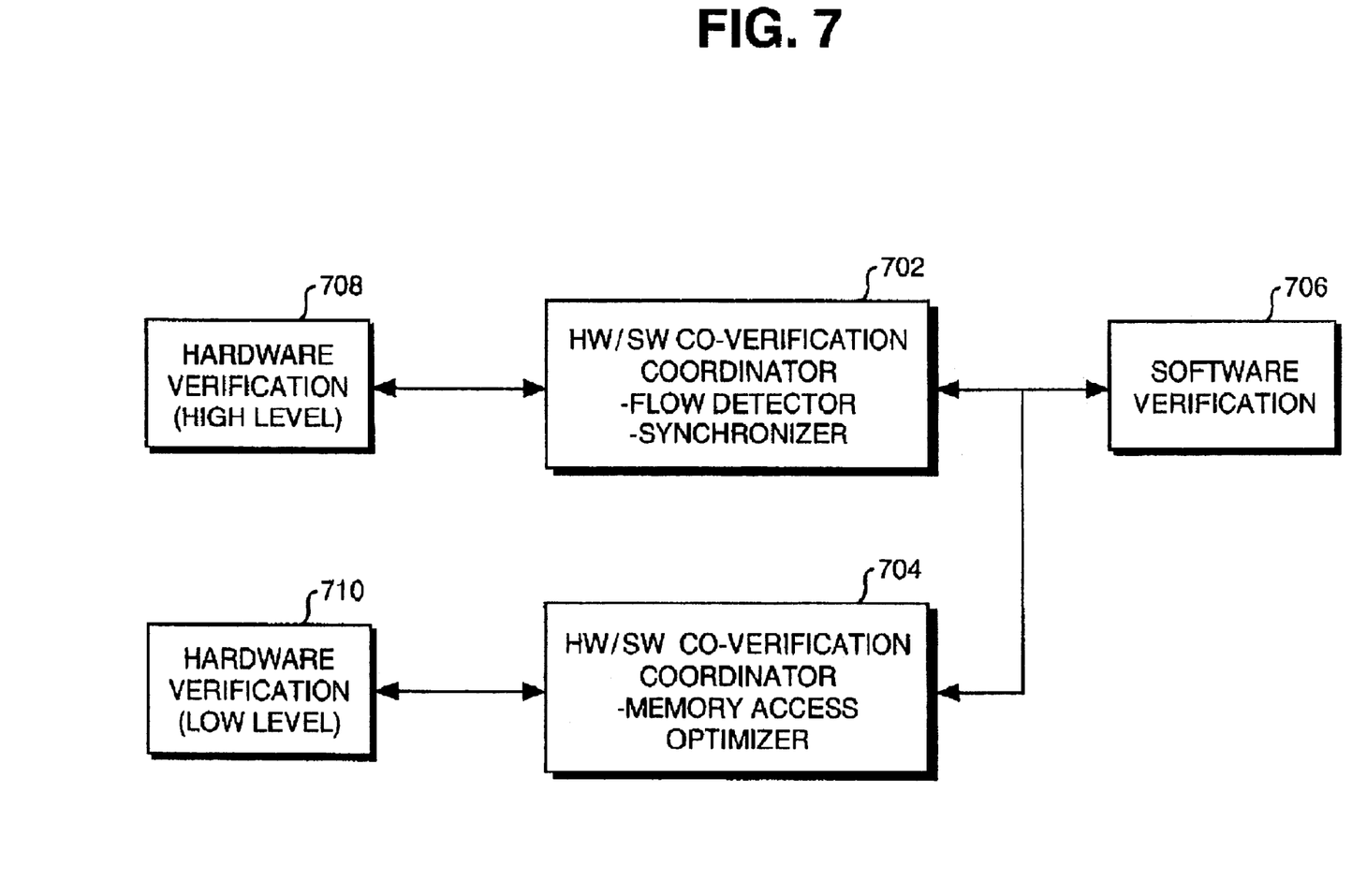
FIG. 7 illustrates another method for practicing the present invention.

FIG. 7 illustrates another method for practicing the present invention, i.e. in conjunction with the optimizing co-verification disclosed in the above identified U.S. Patents ('567 and '370). As illustrated, the method includes the concurrent employment of co-verification coordinator 702 incorporated with the teachings of the present invention (i.e. flow detector, synchronizer and so forth), and co-verification coordinator 704 incorporated with the optimization teachings of U.S. Patents '567 and '370, to simultaneously coordinate software verification 706, hardware verification 708 (performed in a "high" or functional abstraction level), and hardware verification 710 (performed in a "low" or implementation level).

Figure 8:
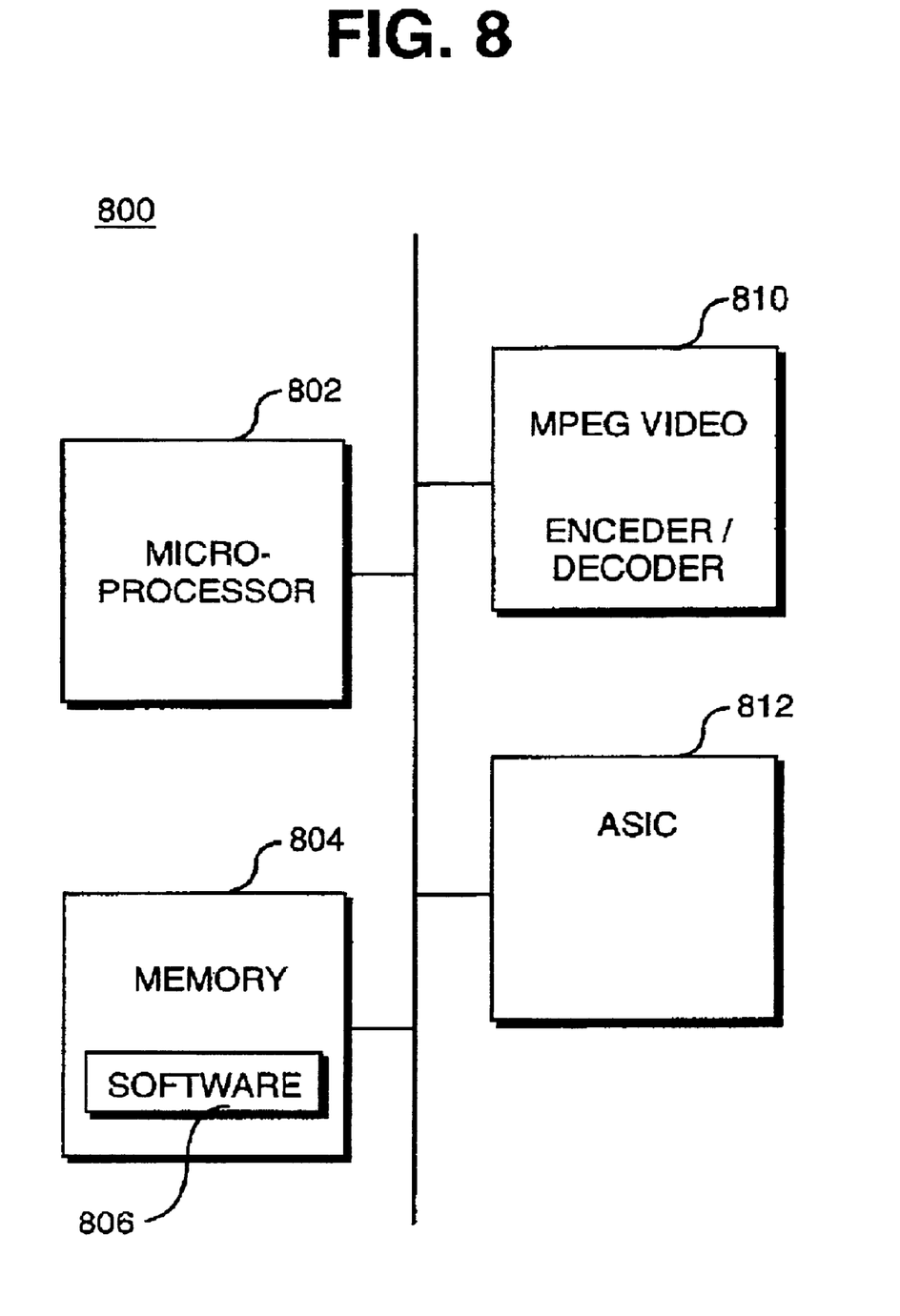
FIG. 8 illustrates an exemplary embedded system that can benefit from the method of FIG. 7.

Before further describing the joint method of FIG. 7, reference is first made to FIG. 8 wherein an exemplary embedded system that can benefit from the method of FIG. 7 is illustrated. As shown, exemplary embedded system 800 includes "off the shelf" microprocessor 802 having a well known instruction set simulator, "off the shelf" memory 804 having a well known memory model, and "off the shelf" MPEG video encoder/decoder 810 having a well known system or high abstraction level model. Additionally, exemplary embedded system 800 includes ASIC 812 and software 806 concurrently being developed.

Referring now back to FIG. 7, software 806 may be verified using the well known instruction set simulator of microprocessor 802 as software verification 706, while ASIC 812 may be verified with a hardware modeler and the like as hardware verification 710 and compatibility of MPEG video encoder/decoder 810 may be verified with a transaction simulator and like as hardware verification 708. The performance of the three way verifications may be substantially improved by having co-verification coordinator 702 incorporated with the teachings of the present invention to coordinate hardware verification 708 and software verification 706 as described earlier, and at the same time, having co-verification coordinator 704 incorporated with the teachings of U.S. Patents '567 and '370 to coordinate hardware verification 710 and software verification 706. In this particular case, the flow detector will also react to memory operations performed by the low level hardware verification as well as those originated from the software verification as described earlier.

In one embodiment, co-verification coordinators 702 and 704 are combined and implemented as a single coordinator. In other embodiments, they are implemented in a distributive manner as multiple units.

Thus, a method and apparatus for performing hardware and software co-verification using deferred synchronization has been described. While the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

What is claimed is:

1. A method comprising:
   accumulating first synchronization events of a verification of a software execution within a system; and
   periodically, providing the accumulated first synchronization events to a verification of a hardware portion of the system, and receiving accumulated second synchronization events of the verification of the hardware portion of the system.

2. The method of claim 1, wherein said accumulating of first synchronization events includes storing the first synchronization events in a first organized data structure, and said receiving of accumulated second synchronization events of the verification of the hardware portion of the system includes storing the second synchronization events in a second organized data structure.

3. The method of claim 1, wherein said accumulating of first synchronization events includes accumulating first memory writing operations generated by the verification of the software execution within the system.

4. The method of claim 1, wherein the providing of accumulated first synchronization events and receiving of accumulated second synchronization events are performed at predetermined synchronization intervals.

5. The method of claim 4, wherein the method further includes configuring the size of the predetermined synchronization interval.

6. The method of claim 5, wherein said configuring includes configuring the size of the predetermined synchronization interval from a first smaller size to a second larger size.

7. The method of claim 5, wherein said configuring includes configuring the size of the predetermined synchronization interval from a first larger size to a second smaller size.

8. The method of claim 7, wherein said configuring from a first larger size to a second smaller size includes reducing the predetermined synchronization interval to where a last event to be synchronized transpired.

9. The method of claim 7, wherein said configuring from a first larger size to a second smaller size includes compressing verification time by a compression ratio.

10. The method of claim 7, wherein said configuring further includes repeating said configuring from a first larger size to a second smaller size with incrementally smaller sizes.

11. The method of claim 1, wherein the method further comprises injecting the received accumulated second synchronization events into the verification of the software execution within the system at corresponding timing offsets into a current synchronization frame.

12. An apparatus comprising:
   a flow detector to monitor, detect and accumulate first synchronization events of a verification of a software execution within a system; and
   a synchronizer coupled to the flow detector to periodically provide the accumulated first synchronization events to a verification of a hardware portion of the system, and receive accumulated second synchronization events of the verification of the hardware portion of the system.

13. The apparatus of claim 12, wherein the flow detector includes a first organized data structure for accumulating the first synchronization events, and a second organized data structure for storing the received accumulated second synchronization events of the verification of the hardware portion of the system.

14. The apparatus of claim 12, wherein the flow detector injects the received accumulated second synchronization events into the verification of the software execution within the system at corresponding timing offsets into a current synchronization frame.

15. The apparatus of claim 12, wherein the synchronizer provides the accumulated first synchronization events and receives the accumulated second synchronization events at predetermined synchronization intervals.

16. The apparatus of claim 15, wherein the apparatus further includes a configurator to configure/reconfigure the size of the predetermined synchronization interval.

17. The apparatus of claim 16, wherein the configurator is also used to compress verification time by a compression ratio.

18. The apparatus of claim 12, wherein the apparatus further includes a selected one of an instruction set simulator and a set of compiled code, coupled to the flow detector, to perform said verification of the software execution within the system.

19. The apparatus of claim 12, wherein the apparatus further includes a transaction level simulator coupled to the synchronizer to perform the verification of the hardware portion of the system.

20. The apparatus of claim 19, wherein the apparatus further includes
   a selected one of an instruction set simulator and a set of compiled code, coupled to the flow detector, to perform said verification of the software execution within the system.
   a selected one of a logic simulator and emulator to perform a second verification of the hardware portion of the system; and
   an optimizing coordinator coupled to the selected one of the instruction set simulator and the set of compiled code, and to the selected one of the logic simulator and emulator, to optimize certain memory accesses performed by the verification of the software execution within the system and the second verification of the hardware portion of the system.

21. A storage medium having stored therein a plurality of programming instructions that are logically related to each other in such a manner, that when executed by a processor, the programming instructions accumulate first synchronization events of a verification of a software execution within a system, and periodically, provide the accumulated first synchronization events to a verification of a hardware portion of the system, and receive accumulated second synchronization events of the verification of the hardware portion of the system.

22. The storage medium of claim 21, wherein the programming instructions provide the accumulated first synchronization events and receive the accumulated second synchronization events at predetermined synchronization intervals.

23. The storage medium of claim 22, wherein the programming instructions further configure the size of the predetermined synchronization interval.

24. The storage medium of claim 23, wherein the programming instructions also compress verification time by a compression ratio.

25. The storage medium of claim 21, wherein the programming instructions also inject the received accumulated second synchronization events at corresponding offsets into a current synchronization frame.

26. A method comprising:
coordinating a verification of a software execution within a system and a first verification of a hardware portion of a system employing a deferred synchronization approach to enhance performance of the verification of the software execution within the system and the first verification of the hardware portion of the system; and
coordinating the verification of the software execution within the system and a second verification of the hardware portion of the system employing optimization to certain memory accesses to enhance performance of the verification of the software execution within the system and the second verification of the hardware portion of the system.

27. The method of claim 26, wherein the coordinating of the verification of the software execution within the system and the first verification of the hardware portion of the system includes accumulating first synchronization events of the verification of the software execution within the system, and periodically, providing the accumulated first synchronization events to the first verification of the hardware portion of the system, and receiving accumulated second synchronization events of the first verification of the hardware portion of the system.

28. The method of claim 27, wherein the periodic providing of the accumulated first synchronization events to the first verification of the hardware portion of the system, and receiving of the accumulated second synchronization events of the first verification of the hardware portion of the system are performed at predetermined synchronization intervals.

29. The method of claim 27, wherein the coordinating of the verification of the software execution within the system and the first verification of the hardware portion of the system further includes injecting the received accumulated second synchronization events of the first verification of the hardware portion of the system into the verification of the software execution within the system at corresponding offsets into a current predetermined synchronization interval.

30. An apparatus comprising:
a first coordinator to coordinate a verification of a software execution within a system and a first verification of a hardware portion of the system employing a deferred synchronization approach to enhance performance of the verification of the software execution within the system and first verification of the hardware portion of the system; and
a second coordinator to coordinate the verification of the software execution within the system and a second verification of the hardware portion of the system employing optimization to certain memory accesses to enhance performance of the verification of the software execution within the system and the second verification of the hardware portion of the system.

31. The apparatus of claim 30, wherein the first coordinator includes a flow detector to monitor, detect and accumulate first synchronization events of the verification of the software execution within the system, and a synchronizer coupled to the flow detector, to periodically provide the accumulated first synchronization events to the first verification of the hardware portion of the system, and receive accumulated second synchronization events of the first verification of the hardware portion of the system.

32. The apparatus of claim 31, wherein the apparatus further comprises a configurator to configure a size for a predetermined synchronization interval to periodically perform said providing of the accumulated first synchronization events to the first verification of the hardware portion of the system, and said receiving of the accumulated second synchronization events of the first verification of the hardware portion of the system.

33. The apparatus of claim 31, wherein the flow detector injects the received accumulated second synchronization events of the first verification of the hardware portion of the system into the verification of the software execution within the system at corresponding offsets into a current predetermined synchronization interval.

34. The apparatus of claim 30, wherein the apparatus further includes a selected one of an instruction set simulator and a set of compiled code, coupled to the flow detector, to perform said verification of the software execution within the system.

35. The apparatus of claim 30, wherein the apparatus further includes a transaction level simulator couple to the synchronizer to perform the verification of the hardware portion of the system.

36. The apparatus of claim 30, wherein the apparatus further includes:
a selected one of an instruction set simulator and a set of compiled code, coupled to the flow detector, to perform the verification of the software execution within the system;
a selected one of a logic simulator and emulator to perform the second verification of the hardware portion of the system; and
an optimizing coordinator coupled to the selected one of the instruction set simulator and the set of compiled code, and to the selected one of the logic simulator and emulator, to optimize certain memory accesses performed by the verification of the software execution within the system and second verification of the hardware portion of the system.

* * * * *

UNITED STATES PATENT AND TRADEMARK OFFICE
CERTIFICATE OF CORRECTION

PATENT NO. : 6,356,862 B2
DATED : March 12, 2002
INVENTOR(S) : Brian Bailey

It is certified that error appears in the above-identified patent and that said Letters Patent is hereby corrected as shown below:

<u>Title page,</u>
Item [56], References Cited, the following references should be listed:

```
--    5,493,672  *  2/1996   Lau et al. .............................395/500
      5,910,897  *  6/1999   Dangelo et al. .......................364/488
      6,052,524  *  4/2000   Pauna ............................395/500.43
      6,061,709  *  5/2000   Bronte ...............................709/103
      6,063,128  *  5/2000   Bentley et al. ...........................703/6 --
```

Signed and Sealed this

Twenty-sixth Day of November, 2002

Attest:

Attesting Officer

JAMES E. ROGAN
*Director of the United States Patent and Trademark Office*